(12) United States Patent
Blackburn et al.

(10) Patent No.: US 9,656,532 B2
(45) Date of Patent: May 23, 2017

(54) VEHICLE CABIN VENTING SYSTEM AND METHOD

(71) Applicant: Ford Global Technologies, LLC, Dearborn, MI (US)

(72) Inventors: Thomas Blackburn, Canton, MI (US); Jesus Cardoso, Allen Park, MI (US); Michael Schamber, Milford, MI (US); James Lawrence Swoish, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 519 days.

(21) Appl. No.: 14/223,786

(22) Filed: Mar. 24, 2014

(65) Prior Publication Data

US 2015/0266354 A1    Sep. 24, 2015

(51) Int. Cl.
| | | |
|---|---|---|
| *B60H 1/34* | (2006.01) | |
| *B60H 1/00* | (2006.01) | |
| *B60H 1/24* | (2006.01) | |
| *B60H 1/26* | (2006.01) | |
| *B60L 11/18* | (2006.01) | |
| *H05K 7/20* | (2006.01) | |
| *H01M 10/46* | (2006.01) | |

(52) U.S. Cl.
CPC ..... *B60H 1/00271* (2013.01); *B60H 1/00278* (2013.01); *B60H 1/241* (2013.01); *B60H 1/248* (2013.01); *B60H 1/26* (2013.01); *B60L 11/1874* (2013.01); *H05K 7/20918* (2013.01); *H01M 10/46* (2013.01); *H01M 2220/20* (2013.01)

(58) Field of Classification Search
CPC   B60K 11/06; B60H 1/00271; B60H 1/00278; B60H 1/26; B60L 11/1874
See application file for complete search history.

(56) References Cited

U.S. PATENT DOCUMENTS

| | | | | |
|---|---|---|---|---|
| 5,524,446 A * | 6/1996 | Hotta | ........ | B60H 1/00392 165/43 |
| 7,005,821 B2 * | 2/2006 | Sunaga | ........ | B60H 1/00857 165/202 |
| 7,451,608 B2 * | 11/2008 | Kikuchi | ........ | B60H 1/00278 62/186 |
| 7,988,543 B2 * | 8/2011 | Major | ........ | B60H 1/00278 454/107 |
| 8,602,091 B2 * | 12/2013 | Nemoto | ........ | B60H 1/00278 165/202 |
| 8,662,968 B2 * | 3/2014 | Leffert | ........ | B60H 1/00278 165/42 |
| 8,950,533 B2 * | 2/2015 | Nemesh | ........ | B60L 11/1812 165/72 |
| 2009/0071178 A1 * | 3/2009 | Major | ........ | B60H 1/00278 62/239 |

(Continued)

*Primary Examiner* — Steven B McAllister
*Assistant Examiner* — Jonathon Cotov
(74) *Attorney, Agent, or Firm* — David Kelley, Esq.; Tung & Associates

(57) ABSTRACT

A vehicle cabin venting method includes cooling a vehicle battery charger by drawing outside air through a vehicle outside air vent door; and operating a hybrid vehicle battery system to establish and maintain flow of fresh air in a cabin of the vehicle by ensuring an open position of a blend door in the vehicle if the outside air vent door will not close. A vehicle cabin venting system is also disclosed.

20 Claims, 6 Drawing Sheets

(56) References Cited

U.S. PATENT DOCUMENTS

| | | | |
|---|---|---|---|
| 2010/0089669 A1* | 4/2010 | Taguchi | B60H 1/00257 180/65.1 |
| 2011/0016899 A1* | 1/2011 | Ogura | B60H 1/00278 62/239 |
| 2011/0059341 A1* | 3/2011 | Matsumoto | B60H 1/00278 429/82 |
| 2011/0165830 A1* | 7/2011 | Smith | B60H 1/00278 454/75 |
| 2011/0298241 A1* | 12/2011 | Varns | B60H 1/00278 296/64 |
| 2012/0003910 A1* | 1/2012 | Richter | B60H 1/00278 454/141 |
| 2013/0337296 A1* | 12/2013 | Cardoso | H01M 2/12 429/61 |
| 2014/0196866 A1* | 7/2014 | Bezzina | B60H 1/00278 165/42 |

* cited by examiner

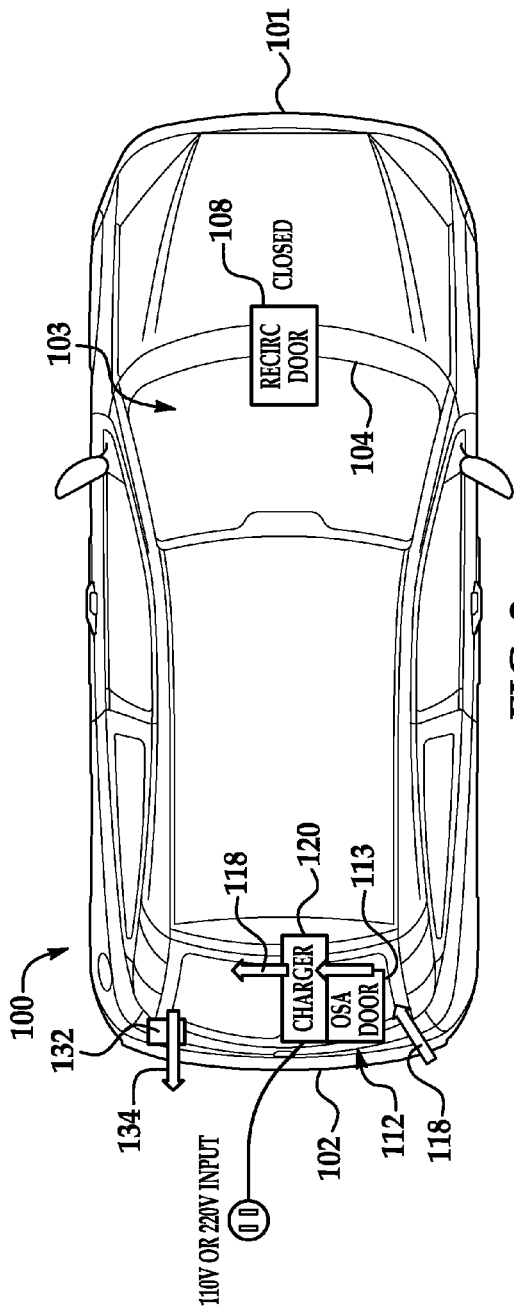
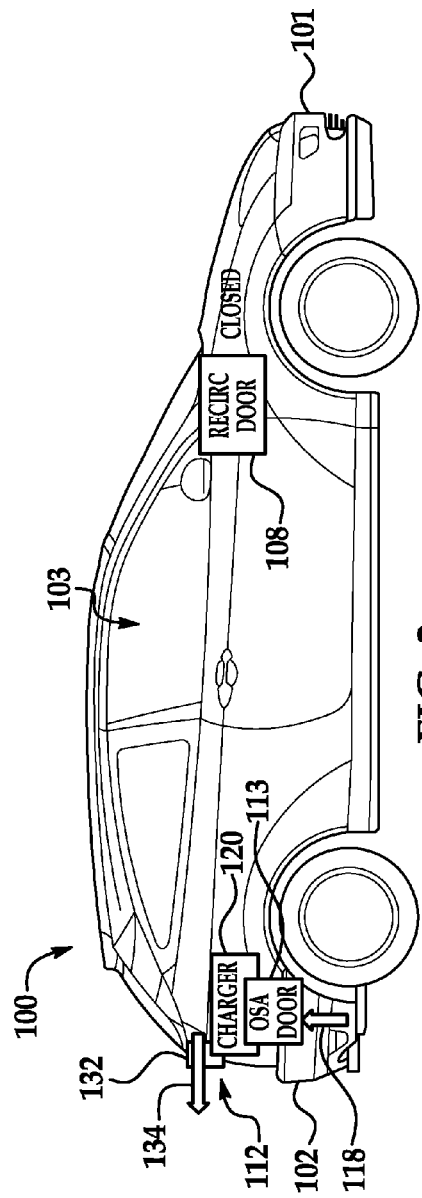
FIG. 2
FIG. 3

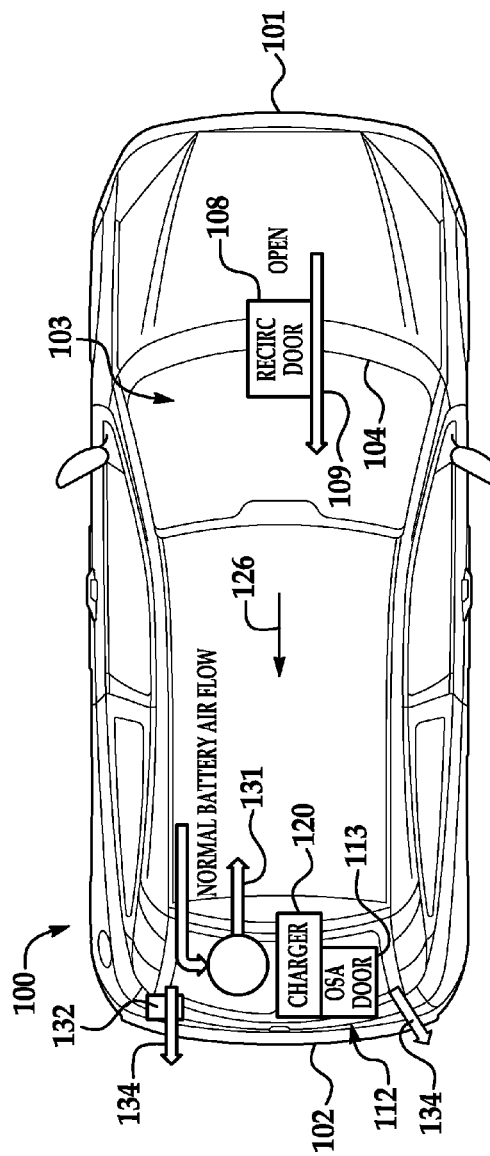
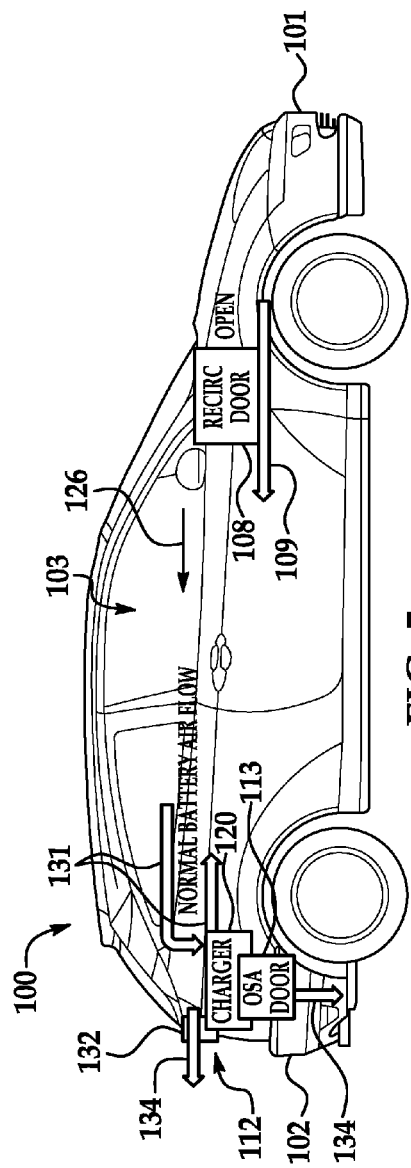
FIG. 4
FIG. 5

VEHICLE CABIN VENTING SYSTEM AND METHOD

FIELD

Illustrative embodiments of the disclosure generally relate to outside air (OSA) vent systems which facilitate flow of cool outside air into the vehicle to cool a battery charger in the vehicle. More particularly, illustrative embodiments of the disclosure relate to a vehicle cabin venting method which facilitates flow of fresh air through a vehicle to prevent inflow of outside air in the event that the OSA vent system does not close.

BACKGROUND

High voltage chargers in PHEV (plug-in hybrid elective vehicles) can become sufficiently heated to warm the cabin air inside the vehicle depending on the starting interior temperature of the vehicle. Circulating inside air to cool the charger for several hours can heat up the inside vehicle air, rendering the charger inefficient.

When the charger requires cooling and the inside cabin air is above a set temperature level, introduction of outside air into the vehicle cabin through an outside air (OSA) vent system in the vehicle may facilitate cooling of the charger. In some circumstances, however, the OSA vent system may inadvertently remain open. Therefore, it may be desirable to facilitate flow of fresh air through the vehicle to prevent inflow of outside air in the event that the OSA vent system does not close.

Accordingly, a vehicle cabin venting method which facilitates flow of fresh air through a vehicle to prevent inflow of outside air in the event that the OSA vent system does not close may be desirable for some applications.

SUMMARY

Illustrative embodiments of the disclosure are generally directed to a vehicle cabin venting method which facilitates flow of fresh air through a vehicle to prevent inflow of outside air in the event that the OSA vent system does not close. An illustrative embodiment of the method includes cooling a vehicle battery charger by drawing outside air through a vehicle outside air vent door; and operating a hybrid vehicle battery system to establish and maintain flow of fresh air in a cabin of the vehicle by ensuring an open position of a blend door in the vehicle if the outside air vent door will not close.

Illustrative embodiments of the method are further generally directed to a vehicle cabin venting system. An illustrative embodiment of the system includes a controller; an outside air vent door interfacing with the controller, controller detects when the vehicle outside air vent door will not close; and a blend door interfacing with the controller, the controller maintains the blend door in an open position when the vehicle outside air vent door will not close.

BRIEF DESCRIPTION OF THE DRAWINGS

Illustrative embodiments of the disclosure will now be described, by way of example, with reference to the accompanying drawings, in which:

FIG. 2 is a top view of a vehicle illustrating normal flow of outside air into the vehicle through the OSA vent system in implementation of an illustrative embodiment of the vehicle cabin venting method;

FIG. 3 is a side view of a vehicle illustrating normal flow of outside air into the vehicle through the OSA vent system in implementation of an illustrative embodiment of the vehicle cabin venting method;

FIG. 4 is a top view of a vehicle illustrating maintenance of positive air pressure in the vehicle under circumstances in which the OSA vent system inadvertently remains opened in implementation of an illustrative embodiment of the vehicle cabin venting method;

FIG. 5 is a side view of a vehicle illustrating maintenance of positive air pressure in the vehicle under circumstances in which the OSA vent system inadvertently remains opened in implementation of an illustrative embodiment of the vehicle cabin venting method;

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable users skilled in the art to practice the disclosure and are not intended to limit the scope of the claims. Moreover, the illustrative embodiments described herein are not exhaustive and embodiments or implementations other than those which are described herein and which fall within the scope of the appended claims are possible. Furthermore, there is no intention to be bound by any expressed or implied theory presented in the preceding technical field, background, brief summary or the following detailed description.

Figure 1:
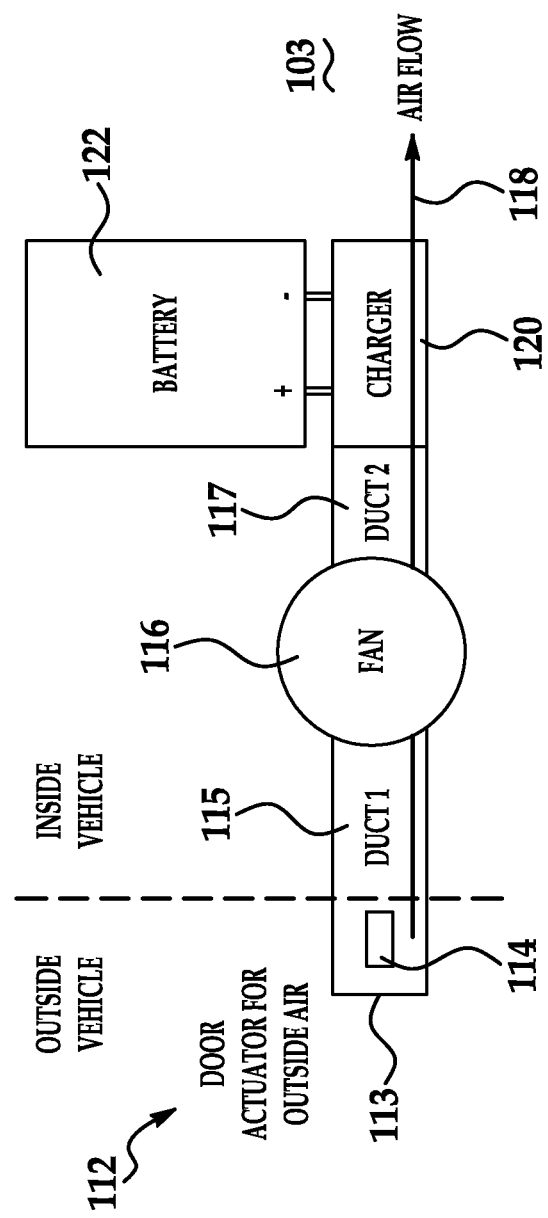
FIG. 1 is a block diagram of an exemplary outside air (OSA) vent system of a vehicle in implementation of an illustrative embodiment of the vehicle cabin venting method.

Referring initially to FIGS. 1-5, a vehicle 100 in implementation of an illustrative embodiment of the vehicle cabin venting method is shown. The vehicle 100 may have a vehicle front end 101, a vehicle rear end 102, a vehicle cabin 103 and a vehicle dashboard 104 in the vehicle cabin 103. A recirculation or blend door 108 may be included in the vehicle dashboard 104. Responsive to operation of the vehicle climate control fan (not shown), the recirculation door 108 may facilitate selective introduction of outside air 109 (FIG. 4) into the vehicle cabin 103 or recirculation of inside air 134 in the vehicle cabin 103, such as in the conventional manner. In exemplary operation, the recirculation door 108 is closed during hot humid weather when the operator of the vehicle 100 selects the "Max A/C" setting on the vehicle climate control system, thereby recirculating cabin air to reduce the heat load on the evaporator and cool the vehicle cabin 103 more quickly. As shown in FIGS. 3 and 4, a battery cooling fan 130 may circulate battery cooling air 131 from inside the vehicle cabin 103 through a vehicle battery 122 (FIG. 1).

An outside air (OSA) vent system 112 may be provided at the vehicle rear end 102 of the vehicle 100. As shown in FIG. 1, the OSA vent system 112 may include an OSA vent door 113 which is selectively opened and closed by operation of a OSA vent door actuator 114. A fan inlet duct 115 may lead from the OSA vent door 113. An OSA fan 116 may be provided in the fan inlet duct 115. A fan outlet duct 117 may lead from the OSA fan 116. A battery charger 120 for a vehicle battery 122 is disposed in thermally conductive contact with the fan outlet duct 117. As shown in FIGS. 2-5, an air extractor 132 may be provided at the vehicle rear end 102 of the vehicle 100 to extract inside air 134 from the vehicle cabin 103.

The outside air vent system 112 may be configured to maintain the OSA vent door 113 in a closed configuration unless the battery charger 120 requires cooling and the temperature of the vehicle cabin 103 exceeds a predetermined set temperature. As shown in FIG. 1, upon opening of the OSA vent door 113 by the OSA vent door actuator 114, the OSA fan 116 draws outside air 118 through the fan inlet duct 115 and the fan outlet duct 117 and into the vehicle cabin 103. As shown in FIGS. 2 and 3, the inflowing outside air 118 cools the battery charger 120 to within a target temperature range which ensures optimal operation of the battery charger 120. Upon cooling of the battery charger 120 to within the target temperature range, the OSA vent door actuator 114 may close the OSA vent door 113 and further operation of the OSA fan 116 may be terminated. Throughout operation of the outside air vent system 112, the recirculation door 108 may remain closed to facilitate recirculation of air in the vehicle cabin 103. The air extractor 132 may remove inside air 134 from the vehicle cabin 103.

According to the vehicle cabin venting method, the Battery Energy Control Module (BECM) of the vehicle 100 may be configured to operate the recirculation door 108 and the vehicle climate control fan (not shown) in an error mitigation strategy in the event that the OSA vent door 113 inadvertently does not close after cooling of the battery charger 120. The error mitigation strategy maintains flow of fresh air 126 in the vehicle cabin 103 and causes the recirculation door 108 to open if it is closed and prevents the recirculation door 108 from closing if it is open, and operates the vehicle climate control fan (not shown). Accordingly, as shown in FIGS. 4 and 5, the vehicle climate control fan (not shown) is operated to blow fresh inflowing outside air 109 into the vehicle cabin 103 through the open recirculation door 108. The inflowing outside air 109 maintains flow of fresh air 126 in the vehicle cabin 103, facilitating flow of inside air 134 from the vehicle cabin 103 through the OSA vent door 113. The flow of fresh air 126 in the vehicle cabin 103 prevents exhaust as well as hot and humid air from entering the vehicle cabin 103 from the rear area of the vehicle 100 through the OSA vent door 113. Since the need to cool the battery charger 120 and operate the vehicle climate control in the "Max A/C" setting on the vehicle climate control system may be likely to occur under the same hot environmental conditions, the probability of the OSA vent door 113 being opened and the recirculation door 108 being closed may be high.

Figure 6:
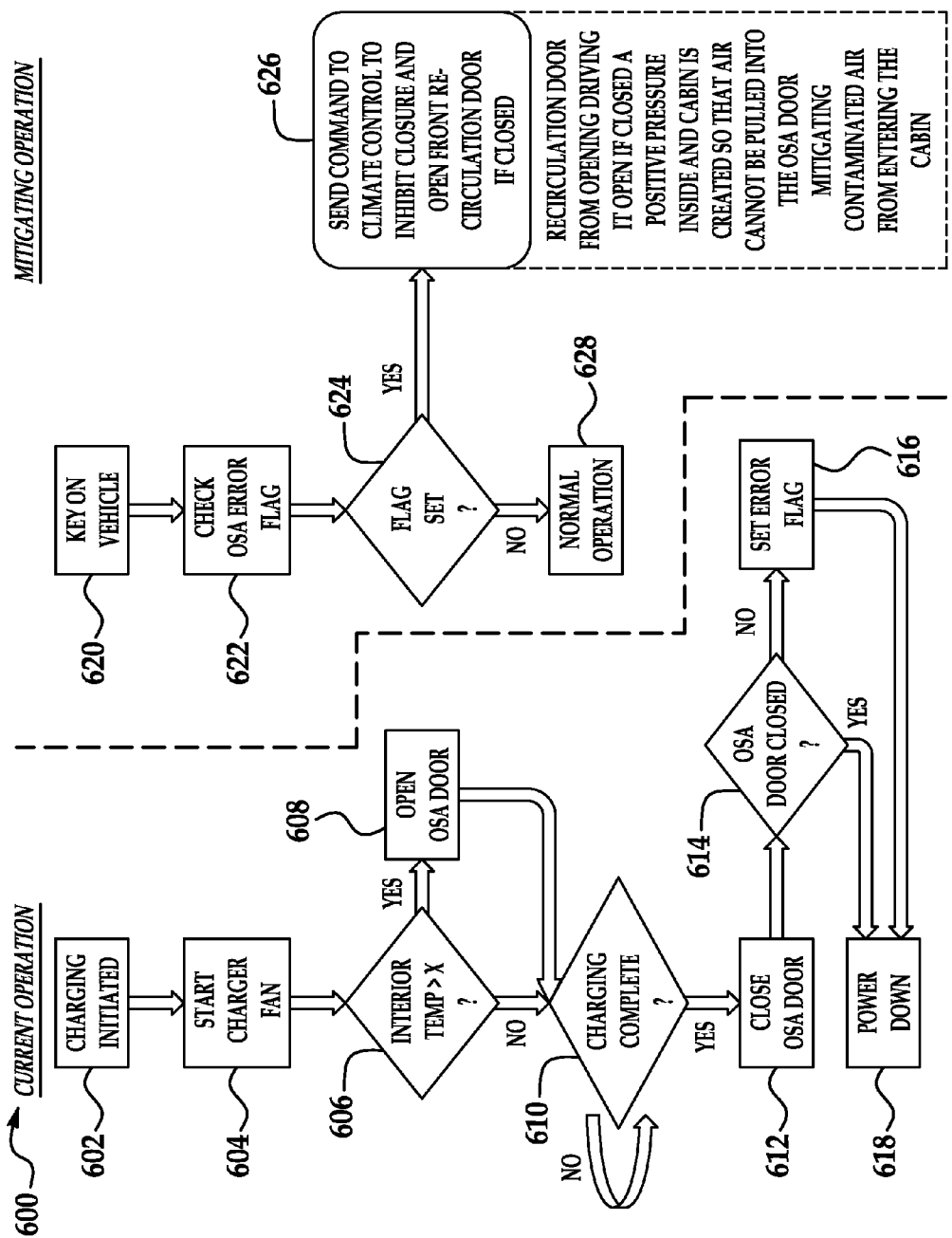
FIG. 6 is a flow diagram which illustrates an illustrative embodiment of the vehicle cabin venting method.

Referring next to FIG. 6, a flow diagram 600 which illustrates an illustrative embodiment of the vehicle cabin venting method is shown. Normal operation of a recirculation door and outside air vent system is shown in blocks 602-618. Mitigating operation of the recirculation door and outside air vent system is shown in blocks 620-628. In block 602, charging of the vehicle battery by operation of the battery charger may be initiated. In block 604, a charger fan which cools the charger may be started. In block 606, a determination may be made as to whether the temperature of the vehicle cabin exceeds a predetermined set temperature. If yes, then the OSA vent door of the outside air vent system may be opened to cool the vehicle cabin interior. If no, then a determination may be made as to whether charging of the vehicle battery is complete.

Upon charging of the vehicle battery in block 610, the OSA vent door may be closed in block 612. In block 614, verification may be made as to whether the OSA vent door is closed. If the OSA vent door is closed in block 614, then the OSA vent door is powered down in block 618. If the OSA vent door is not closed in block 614, then an error flag is set in block 616 and the OSA vent door is powered down in block 618.

In the event that the OSA vent door is not closed in block 614 and the error flag is set in block 616, mitigating operation of the recirculation door and outside air vent system is carried out in blocks 620-628. In block 620, the vehicle is keyed on. In block 622, the OSA error flag which was set in block 616 is checked. In block 624, verification may be made as to whether the OSA error flag was set. If yes, then in block 626, a command may be transmitted to the vehicle climate control system to inhibit closure and open the front recirculation door if closed. Accordingly, fresh air flows through the vehicle cabin such that air is not able to enter the cabin interior through the open OSA vent door. If the OSA error flag was not set in block 624, then normal operation of the recirculation door may be carried out in block 628.

Figure 7:
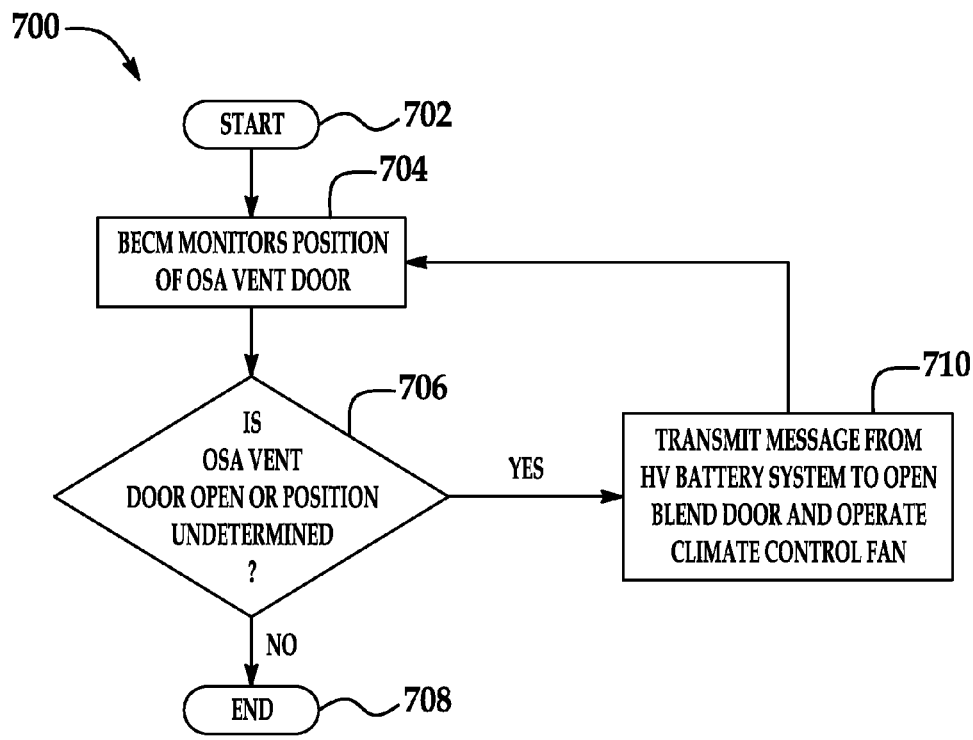
FIG. 7 is a flow diagram which illustrates an exemplary control algorithm according to an illustrative embodiment of the vehicle cabin venting method.

Referring next to FIG. 7, a flow diagram 700 which illustrates an exemplary control algorithm according to an illustrative embodiment of the vehicle cabin venting method is shown. The method may start at block 702. At block 704, a BECM (Battery Energy Control Module) may monitor the position of the OSA vent door. At block 706, a determination may be made as to whether the OSA vent door is open or the position of the OSA door is undetermined. If the outcome of the query at block 706 reveals that the OSA vent door is not open, then the method may end at block 708.

If the outcome of the query at block 706 reveals that the OSA vent door is either open or undetermined, then at block 710 a message may be transmitted from an HV (Hybrid Vehicle) battery system to open a blend door and operate a climate control fan. The method may return to block 704, where the method may be repeated.

Figure 8:
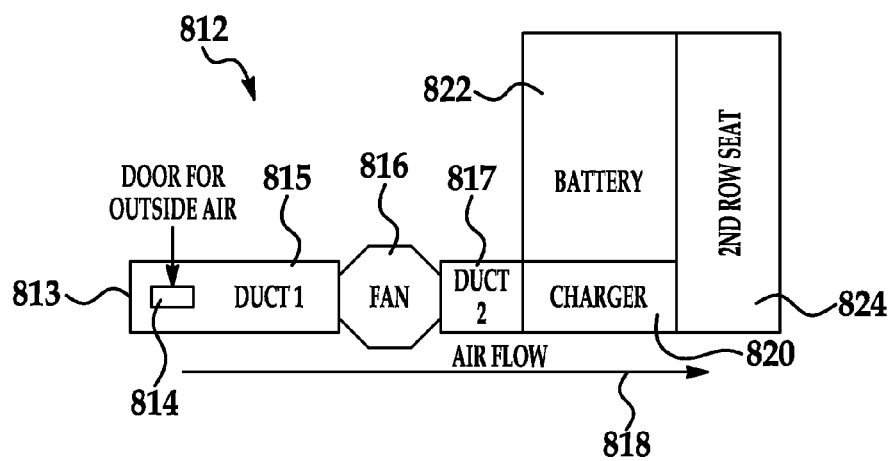
FIG. 8 is a block diagram of another exemplary outside air (OSA) vent system of a vehicle in implementation of an illustrative embodiment of the vehicle cabin venting method.

Referring next to FIG. 8, a block diagram 812 of another exemplary outside air (OSA) vent system of a vehicle in implementation of an illustrative embodiment of the vehicle cabin venting method is shown. The OSA vent system 812 may include an OSA vent door 813 which is selectively opened and closed by operation of a OSA vent door actuator 814. A fan inlet duct 815 may lead from the OSA vent door 813. An OSA fan 816 may be provided in the fan inlet duct 815. A fan outlet duct 817 may lead from the OSA fan 816. A battery charger 820 for a vehicle battery 822 is disposed in thermally conductive contact with the fan outlet duct 817. When the OSA vent door actuator 814 opens the OSA vent door 813, the OSA fan 816 draws outside air 818 from outside the vehicle through the fan inlet duct 815 and the fan outlet duct 817, respectively, to cool the battery charger 820.

A portion of the outside air 818 may be directed beyond the battery charger 820 toward a second row seat 814 of the vehicle.

Figure 9:
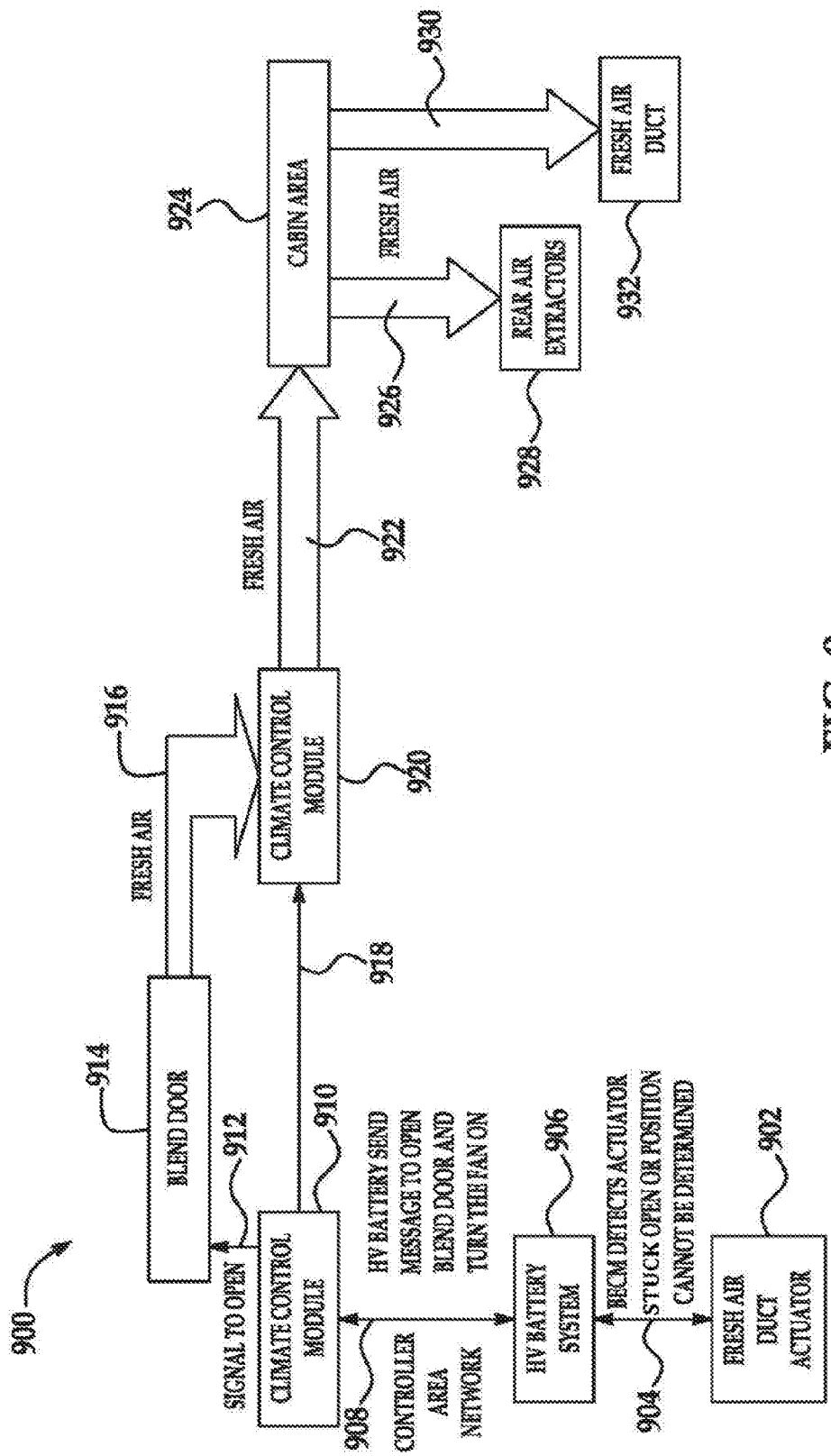
FIG. 9 is a block diagram which illustrates an illustrative embodiment of the vehicle cabin venting method.

Referring next to FIG. 9, a block diagram 900 which illustrates an illustrative embodiment of the vehicle cabin venting method is shown. According to the method, an OSA vent door actuator 902 opens an OSA vent door in a vehicle to cool a battery charger. A BECM (Battery Energy Control Module) detects that the actuator is stuck in an open position or that the position of the actuator cannot be determined 904. An HV (Hybrid Vehicle) battery system 906 transmits a message, via a CAN (Controller Area Network) 908, to a climate control module 910 to open a blend door and turn the climate control fan of the vehicle on. The climate control module 910 transmits a signal 912 which opens the blend door 914. Consequently, the fresh air 916 flows through the open blend door 914 to a climate control fan 920 in the vehicle.

The climate control module 910 additionally transmits a signal 918 which operates the climate control fan 920 of the vehicle. The climate control fan 920 blows fresh air 922 from the open blend door 914 into the cabin area 924 of the vehicle. Fresh air 926 may flow from the cabin area 924 through the rear air extractors 928 at the rear of the vehicle. Fresh air 930 may also flow from the cabin area 924 through the fresh air ducts 932 at the rear of the vehicle.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A battery charger cooling method, comprising:
    cooling a vehicle battery charger by drawing outside air through a vehicle outside air vent door; and
    operating a hybrid vehicle battery system to establish and maintain flow of fresh air in a cabin of the vehicle by ensuring an open position of a blend door in the vehicle if the outside air vent door will not close in response to a command from a controller to close the outside air vent door, the position of the air vent door determined by the controller;
    the ensuring an open position of a blend door comprising the controller causing the blend door to be in an open position if the blend door is determined to be in a closed position and causing prevention of closure of the blend door if the blend door is determined to be in an open position.

2. The method of claim 1 further comprising drawing outside air through the vehicle outside air vent door by operating the hybrid vehicle battery system to operate an outside air fan.

3. The method of claim 1 wherein operating the hybrid vehicle battery system to establish and maintain flow of fresh air in a cabin of the vehicle by ensuring an open position of a blend door in the vehicle comprises operating the hybrid vehicle battery system to operate a vehicle climate control fan.

4. The method of claim 1 wherein cooling a vehicle battery charger comprises opening the vehicle outside air vent door in the vehicle if a temperature of the cabin of the vehicle exceeds a predetermined set temperature.

5. The method of claim 1 wherein drawing outside air through the outside air vent door comprises drawing outside air through the outside vent door through a fan outlet duct disposed in thermally conductive contact with a vehicle battery charger.

6. The method of claim 1 wherein ensuring an open position of a blend door in the vehicle comprises operating a battery energy control module to open the blend door from a closed position wherein the controller comprises the battery energy control module.

7. The method of claim 1 wherein ensuring an open position of a blend door in the vehicle comprises operating a battery energy control module to maintain the blend door in an open position wherein the controller comprises the battery energy control module.

8. The method of claim 1 further comprising removing inside air from the cabin of the vehicle.

9. A battery charger cooling method, comprising:
    charging a vehicle battery of a vehicle by operation of a vehicle battery charger;
    cooling the vehicle battery charger by opening an outside air vent door in a vehicle and drawing outside air from outside the vehicle, through the outside air vent door into a cabin of the vehicle;
    operating a battery energy control module to determine whether the outside air vent door is closed; and
    operating a hybrid vehicle battery system to establish and maintain flow of fresh air in a cabin of the vehicle by ensuring an open position of a blend door in the vehicle if the outside air vent door will not close in response to a command from battery energy control module to close the outside air vent door, the position of the air vent door determined by the battery energy control module;
    the ensuring an open position of a blend door comprising the controller causing the blend door to be in an open position if the blend door is determined to be in a closed position and causing prevention of closure of the blend door if the blend door is determined to be in an open position.

10. The method of claim 9 further comprising further comprising drawing outside air through the outside air vent door by operating the hybrid vehicle battery system to operate an outside air fan.

11. The method of claim 9 wherein operating a hybrid vehicle battery system to establish and maintain flow of fresh air in a cabin of the vehicle by ensuring an open position of a blend door in the vehicle comprises operating the hybrid vehicle battery system to operate a vehicle climate control fan.

12. The method of claim 9 wherein cooling a vehicle battery charger comprises opening the outside air vent door in the vehicle if a temperature of the cabin of the vehicle exceeds a predetermined set temperature.

13. The method of claim 9 wherein drawing outside air through the outside air vent door comprises drawing outside air through the outside vent door through a fan outlet duct disposed in thermally conductive contact with the vehicle battery charger.

14. The method of claim 9 wherein ensuring an open position of a blend door in the vehicle comprises operating the battery energy control module to open the blend door from a closed position.

15. The method of claim 9 wherein ensuring an open position of a blend door in the vehicle comprises operating the battery energy control module to maintain the blend door in an open position.

16. The method of claim 9 further comprising removing inside air from the cabin of the vehicle.

17. A vehicle cabin venting system, comprising:
    a controller;

an outside air vent door interfacing with the controller, the controller configured to determine when the vehicle outside air vent door will not close in response to a command from the controller to close the outside air vent door, the position of the air vent door determined by the controller; and a blend door interfacing with the controller, the controller configured to maintain the blend door in an open position when the vehicle outside air vent door will not close;

the maintaining the blend door in an open position comprising the controller causing the blend door to be in an open position if the blend door is determined to be in a closed position and causing prevention of closure of the blend door if the blend door is determined to be in an open position.

18. The system of claim 17 wherein the controller comprises a hybrid vehicle battery system, the outside air vent door interfacing with the hybrid vehicle battery system.

19. The system of claim 18 further comprising a climate control module interfacing with the hybrid vehicle battery system, the climate control module interfacing with the blend door.

20. The system of claim 19 further comprising a climate control fan interfacing with the blend door and the climate control module.

* * * * *